United States Patent [19]

Peacock

[11] Patent Number: 4,751,655

[45] Date of Patent: Jun. 14, 1988

[54] METHOD OF RECONSTITUTING SEISMIC DATA

[75] Inventor: Kenneth L. Peacock, Tulsa, Okla.

[73] Assignee: Amoco Corporation, Chicago, Ill.

[21] Appl. No.: 872,994

[22] Filed: Jun. 11, 1986

[51] Int. Cl.$^4$ .................. G01V 1/30; H04B 15/00; G06F 7/38

[52] U.S. Cl. .................. 364/487; 364/421; 364/572; 364/577; 364/724; 367/21

[58] Field of Search .......... 364/572, 577, 481, 421, 364/724, 487; 346/33 C; 367/74, 21, 38, 43, 47, 68, 66, 64, 28–29; 324/77 R, 77 CS; 328/54, 53, 165, 167

[56] References Cited

U.S. PATENT DOCUMENTS

| | | | |
|---|---|---|---|
| 4,192,003 | 3/1980 | Brock et al. | 364/487 |
| 4,204,279 | 5/1980 | Parrack et al. | 364/421 |
| 4,312,050 | 1/1982 | Lucas | 367/43 |
| 4,455,613 | 6/1984 | Shoemaker | 364/487 |
| 4,462,083 | 7/1984 | Schwefel | 364/577 |
| 4,543,632 | 9/1985 | Ergas et al. | 367/21 |
| 4,689,759 | 8/1987 | Anouar et al. | 364/572 |

FOREIGN PATENT DOCUMENTS 0030257 3/1978 Japan .................. 364/577

OTHER PUBLICATIONS

R. Kalyanakrishnan, "A Bit–Slice Controller for Cubic Spline Generation", 4/84, pp. 93–95.

Primary Examiner—Parshotam S. Lall
Assistant Examiner—David C. Goldman
Attorney, Agent, or Firm—S. H. Brown; F. E. Hook

[57] ABSTRACT

At least two methods of reconstituting the original form of a time/amplitude trace, such as seismic data, are disclosed wherein the seismic data has been rectified by a scanner to produce a signal representative of a hardcopy display of the trace. One of the methods comprises selecting a time window of a certain duration, obtaining a measurement of the predominant period within the selected positive components of the signal, and filtering the signal with a bandpass filter having a range of about F/2 to about 3F/2, where F equals the reciprocal of the predominant period of the signal.

7 Claims, 3 Drawing Sheets

METHOD OF RECONSTITUTING SEISMIC DATA

BACKGROUND OF THE INVENTION

1. Field of the Invention

The present invention relates to methods of reconstituting a time amplitude vs trace and, more particularly, to methods wherein the trace has been rectified by a scanner to produce a signal representative of a hardcopy display of the trace.

2. Setting of the Invention

During the acquisition of seismic data which is to be used in the exploration for hydrocarbons and minerals, large quantities of analog or digital data pulses are recorded on magnetic tape. These magnetic tapes are then processed to enhance the interpretability of the seismic data and most often, a hardcopy display of the seismic data, called a seismic section, is produced. The seismic section contains a plurality of wavy lines or traces formed on a time vs amplitude scale, which are then utilized by the skilled log analyst or geophysicist to determine if desirable hydrocarbons or minerals are located below the location where the seismic data was obtained. After the seismic section is produced, the processed seismic data is erased or destroyed so that the only remaining evidence of the seismic data is the seismic section.

If at a later date reprocessing of the seismic data is desired, the original form of the seismic section must be reconstituted or regenerated. One manner to accomplish this is to use an optical scanning device that is passed over each trace to reconstitute the data in an analog wave representative of the original form, as is well known in the art. A problem arises in this instance because most optical scanning devices are only capable of reproducing the positive values of the waveform, i.e. the negative values of the waveforms cannot be determined or reconstituted by this manner. Further, oftentimes the amplitudes of the traces above a certain maximum value are clipped, i.e., removed or flattened. An example of a signal which has no negative values and which has been amplitude clipped as from an optical scanner is shown in FIG. 1. The signal is shown in solid lines while the missing portions of the original signal is shown in dotted lines.

Obviously, the above-described deficiencies with the reconstituted signals can cause poor response to subsequent seismic processing methods, such as filtering, automatic event detection or "picking", or amplitude manipulation. There exists a need for a method of reconstituting the entire signal from an optical scanner.

Prior art methods of signal reconstituting are disclosed in U.S. Pat. No. 4,192,003, Brock, et al.; U.S. Pat. No. 4,455,613, Shoemaker; and U.S. Pat. No. 4,462,083, Schwefel. All these methods utilize interpretations of the peaks of the signal by measurement of the slopes of the different wave angles adjacent the portions of the signal to be reconstituted. These methods are useful in reconstituting signals from traces that have a high noise-to-signal ratio. However, these prior art methods cannot be utilized to reconstitute signals that contain both (a) no negative values and (b) clipped amplitudes because the methods cannot reconstruct the negative portions of the signal, given only positive portions.

SUMMARY OF THE INVENTION

The present invention provides at least two methods of reconstituting the original form of a time/amplitude trace, such as seismic data, which has been rectified by an optical scanner to produce a signal representative of a hardcopy display of the trace. One method comprises selecting a time window of certain duration. Thereafter, a measurement is obtained of the predominant period of the wave or signal within the selected time window. The signal is filtered with a bandpass filter having a range of F/2 to 3F/2, where F equals the reciprocal of the predominant period of the signal. Another method of the present invention comprises selecting the positive components of the signal and determining which positive components have been amplitude clipped. The amplitude clipped components are rejected. Thereafter, the remaining components are interpolated to reconstitute the original form of the trace, such as by using cubic spline interpolation.

The present invention can be utilized with analog or digital signals which contain no negative components and/or include clipped amplitude components. By the use of the present invention, a highly accurate and computationally efficient method is disclosed for reconstituting a trace generated from a hardcopy. No prior device or method known by the inventor hereof can accomplish the same purposes of the present invention given the specific input data contemplated herein.

DETAILED DESCRIPTION OF THE PREFERRED EMBODIMENT

Figure 1:
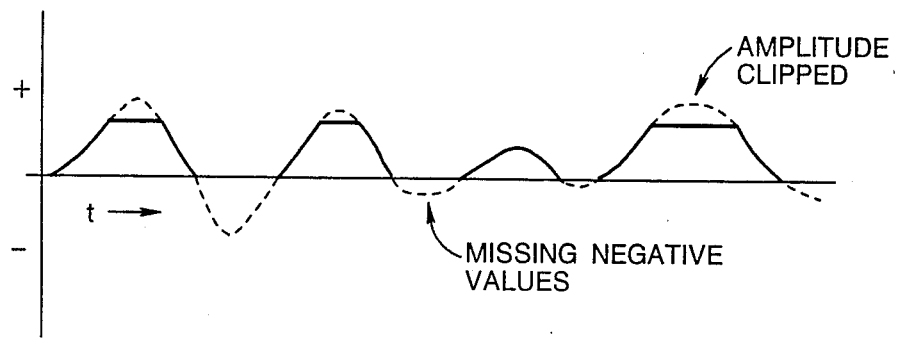
FIG. 1 illustrates a signal generated from an optical scanner where the data is deficient, having no negative values and some positive values being clipped, i.e., truncated at a particular level.
Figure 2:
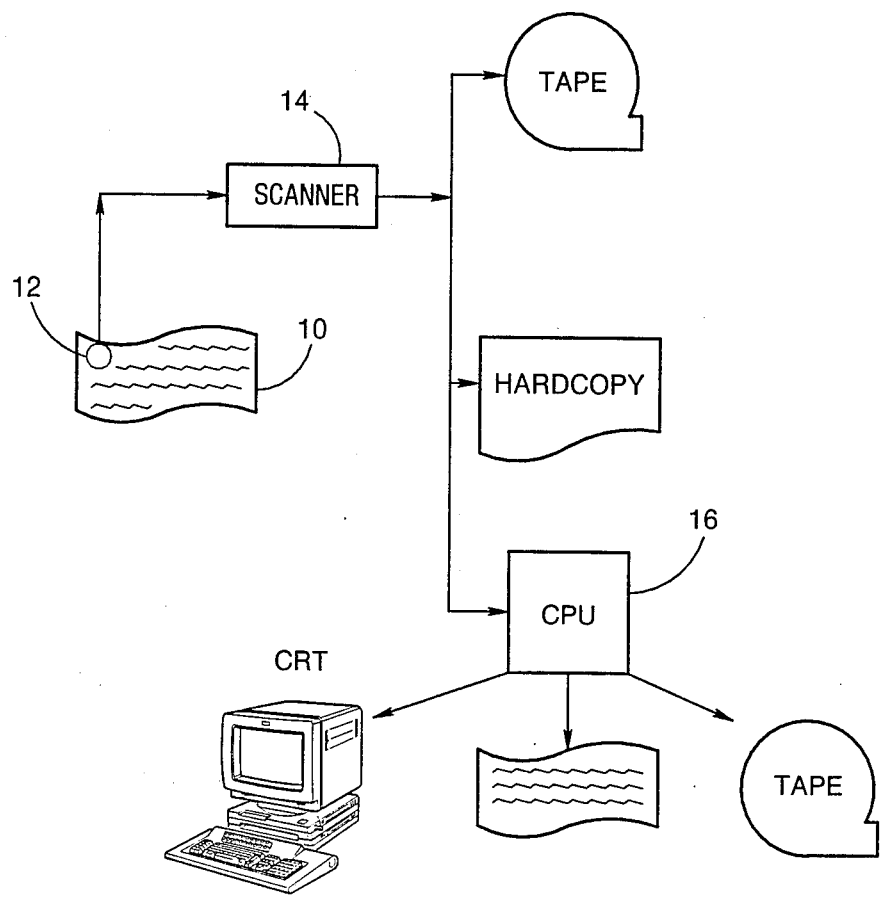
FIG. 2 is a diagrammatic representation of apparatus of the present invention in use reconstituting the original form of a time/amplitude trace.

In FIG. 2, a seismic section 10 which contains a plurality of traces, as is well known in the art, is scanned by an optical scanner head 12. An electrical signal from the head 12 is sent to the optical scanner unit 14, such as a unit marketed by Scitex Corporation. Within the scanner unit 14 the signal is transformed into a digital or an analog form to represent each trace. The output of the scanner unit 14 can be of three types: tape, hardcopy, or direct signal to a CPU (central processing unit) 16. Usually, the output is a tape which is then inputted for use by the CPU 16. The CPU 16 comprises a programmable digital computer that contains the programming necessary to carry out the methods of the present invention to generate the original form of the traces and output the traces to a visual display terminal, as a hardcopy, or onto magnetic tape.

Figure 3:
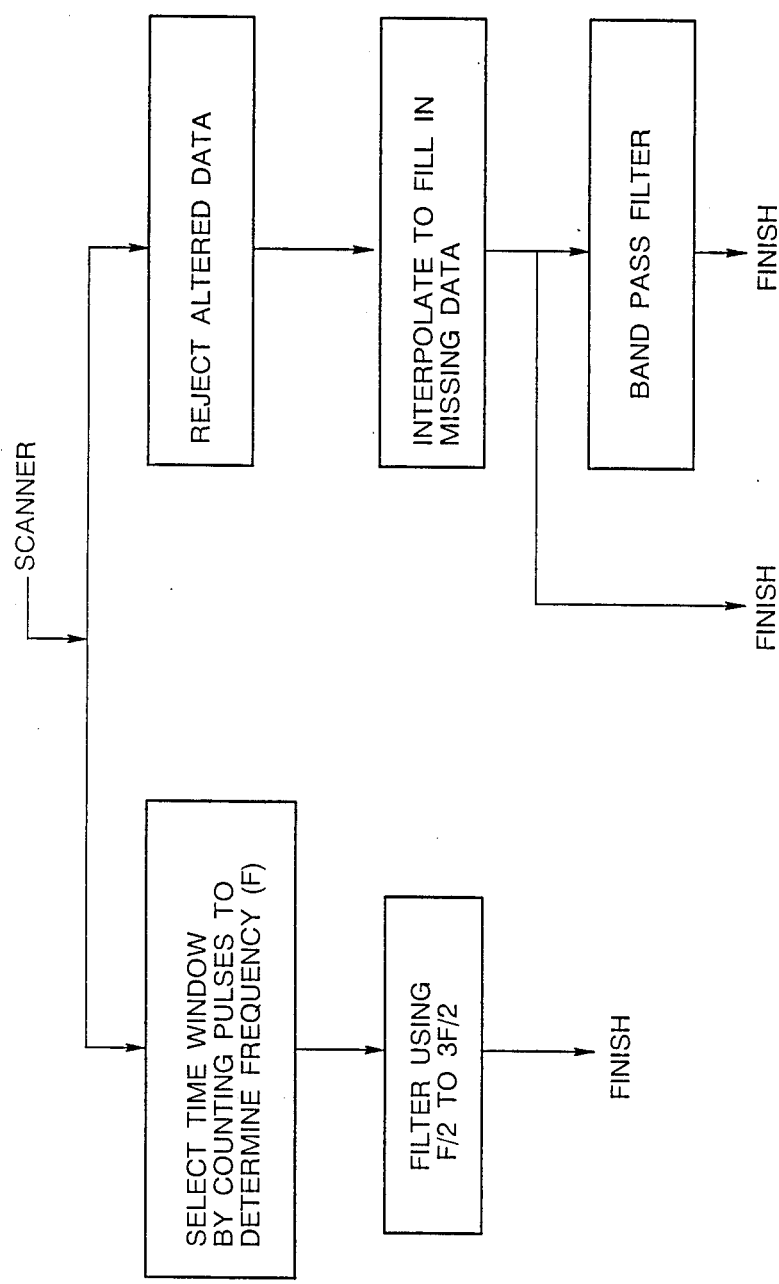
FIG. 3 is a flow chart illustrating the two methods of the present invention.

As shown in FIG. 3, in the first method of the present invention, the signal from the optical scanner 14 has been loaded into associated memory with the CPU 16. The operator then chooses a time window of a time "t". The value of "t" can be from about 0.5 to about 2.0 seconds, depending upon the signal-to-noise ratio of the signal and the particular lithographic characteristics of the location from which the data was obtained.

Within the selected time window "t" set forth above, a measurement is made of the predominant period, which is a function of the predominant signal frequency (F). In one embodiment, this predominant period of the signal is determined by counting the positive pulses of the digital value within the selected time window.

The trace is interpolated by using a bandpass filter. The purpose of the bandpass filter in this method is to interpolate the data with a bandpass operator similar to that used in digital-to-analog interpolation. The user provides the maximum and minimum filter limits (in Hz) based upon outside supplied information. A bandpass filter having a range of about F/2 to about 3F/2, where F equals 1/P where P equals the predominant period determined in the above method, can be used. This range of F/2 to 3F/2 is chosen because this range will encompass of F/2 to the total range of frequencies that have been affected by the altering of the signal, caused by the optical scanner.

For the purpose of the present invention, interpolation can be thought of in the following manner: An original continuous signal has been sampled every two milliseconds, and the signal has been filtered prior to sampling, so that essentially all signal components above, for example, 250 cps in frequency have been removed. Consecutive values of the sample can be represented by vertical bars. The basic statement of sampling theory is that given the above premises, the original filtered signal can be reconstructed to any desired degree of accuracy from the sample data. The reconstruction process comprises replacing every sample bar with an "interpolation function" of equivalent peak height. The interpolation function is a "sinc" function of the form sin x/x. The value of this function can be specified at as many points as desired between the above identified 0.002 second sample points. The reconstructed signal is formed by adding the contributions of all interpolation functions. Each point of reconstruction, therefore, involves the contributions from samples up to infinite "distances" earlier and later in time. Furthermore, the interpolation, for example, is limited to points 0.0005 seconds apart in time. The interpolation, however, can be carried to any reasonable desired degree of accuracy. The economic cost of performance can, of course, impose a limit. The "statistical blur" related to original quantitizing errors still remains and sets an upper limit to meaningful refinement.

The previously described method provides adequate to very good reconstituting of the negative values of the signals; however, some of the positive values can be distorted. Another method will be described below which distorts the positive values to a lesser degree than the first method. The difference between the two methods primarily is that the second method has an effect on the missing data without disturbing the remaining data. Therefore, the first method is preferably used on data where a quick, but reliable method is desired while the second method is preferably used on data where a more accurate method is desired.

As shown in FIG. 3, the second method starts with selecting only the full form positive components of the signal to reject those amplitude clipped portions and those portions that represent the missing negative values. The positive components are selected which are at least equivalent to a dominant portion of the maximum amplitude of the signal within a selected time window. This procedure is used to determine those portions which have been amplitude clipped, because those portions that have been clipped are to be reconstituted. The dominant portion of maximum amplitude usually can be anything greater than about 70% to about 99% of the original signal's amplitude, and preferably greater, than about 97%.

The remaining data is interpolated to fill in the missing components. Such interpolation can be an process, is well known to those skilled in the art. For example, see "Adaptive Interpoautoregressive lation of Discrete-Time Signals that can be Modeled as Autoregressive Processes," by Janssen, Veldhuis, and Vries, Transactions on Acoustics, Speech, and Signal Processing, Vol. ASSP-34, No. 2, April 1986. Preferably, the interpolation method used is cubic spline curve fitting method which is well known to those skilled in the art.

Figure 4:
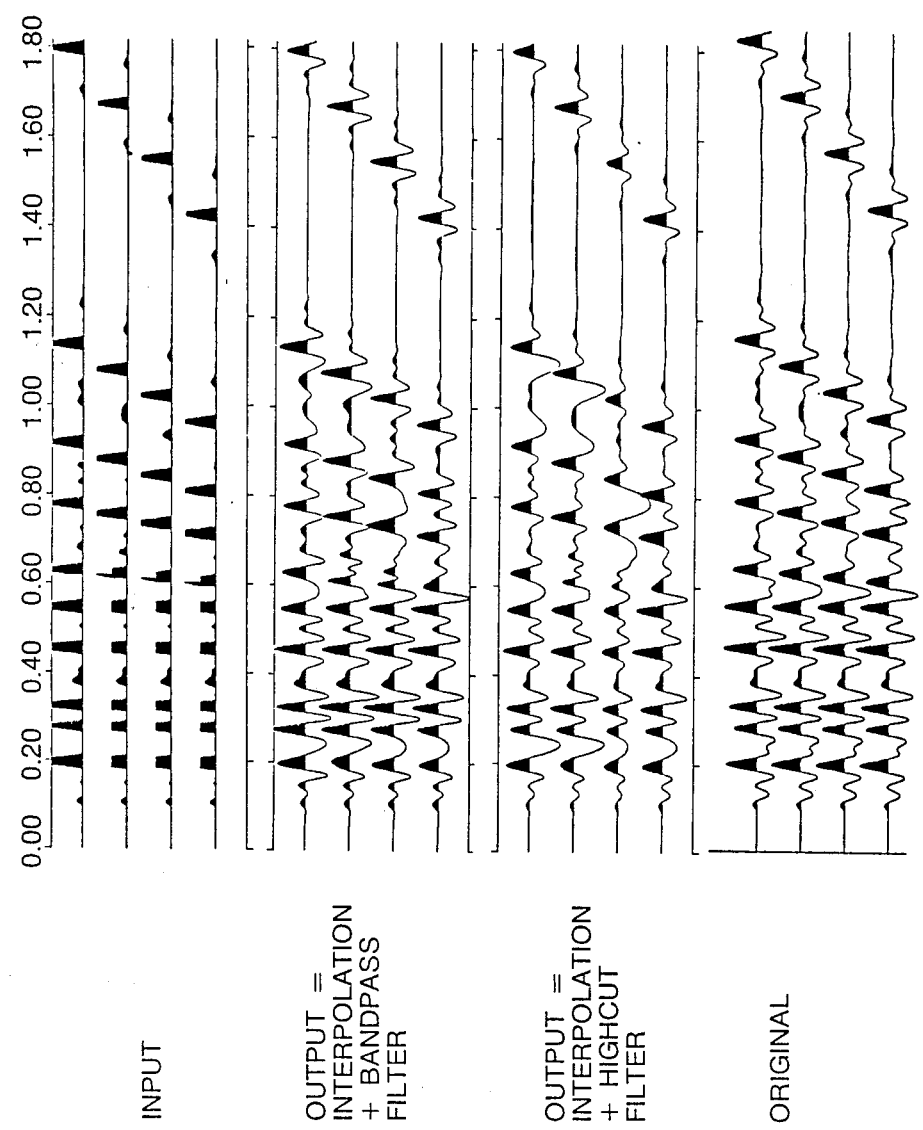
FIG. 4 is an illustration of the input and output data from use of one method of the present invention.

FIG. 4 shows a sample input of a seismic section to be optically scanned. After scanning of the seismic section, the signal is then processed using the second method of the present invention using either a bandpass or a high-cut filter. The resulting wave forms are shown in FIG. 4 and can be compared to the original wave form at the bottom of FIG. 4.

Wherein the present invention has been described in particular relation to the drawings attached hereto, it should be understood that other and further modifications, apart from those shown or suggested herein, may be made within the scope and spirit of the present invention.

What is claimed is:

1. A method of reconstituting a time/amplitude trace, which has been rectified by a scanner to produce a signal representative of a hardcopy display of the time-/amplitude trace, comprising:
    (a) selecting a time window of a certain duration;
    (b) obtaining a measurement of a predominant period of the signal within the selected time window; and
    (c) filtering the signal with a bandpass filter having a range of about F/2 to about 3F/2, where F equals the reciprocal of the predominant period of the signal.

2. The method of claim 1 wherein step (b) comprises counting positive components within the selected time window.

3. The method of claim 1 wherein step (c) comprises a band-limited interpolator to restore missing portions of the signal.

4. A method of reconstituting a time/amplitude trace, which has been rectified by a scanner to produce a signal representative of a hardcopy display of the time-/amplitude trace, comprising:
    (a) selecting positive components of the signal;
    (b) determining which positive components of (a) have been amplitude clipped;
    (c) rejecting determined amplitude clipped components; and
    (d) interpolating nonrejected positive components of the signal to reconstitute the time/amplitude trace.

5. The method of claim 4 whereien step (d) includes using cubic-spline interpolation.

6. The method of claim 4 and including a step (e) which comprises bandpass filtering the signal of (d).

7. A method of reconstituting a time/amplitude trace, comprising:
    (a) passing an optical scanner device across a time-/amplitude trace of a seismic section to produce a signal for the time/amplitude trace
    (b) selecting positive components of the signal
    (c) determining which of the positive components of the signal have been amplitude clipped and rejecting all components of the signal that have been amplitude clipped; and
    (d) interpolating nonrejecting positive components of the signal to reconstitute the time/amplitude trace.

* * * * *